(12) United States Patent
Uchida et al.

(10) Patent No.: US 8,421,188 B2
(45) Date of Patent: Apr. 16, 2013

(54) SEMICONDUCTOR DEVICE INCLUDING A GUARD RING SURROUNDING AN INDUCTOR

(75) Inventors: Shinichi Uchida, Kanagawa (JP); Yasutaka Nakashiba, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 11 days.

(21) Appl. No.: 13/067,774

(22) Filed: Jun. 24, 2011

(65) Prior Publication Data

US 2011/0316118 A1    Dec. 29, 2011

Related U.S. Application Data

(63) Continuation of application No. 12/292,665, filed on Nov. 24, 2008, now Pat. No. 7,999,386.

(30) Foreign Application Priority Data

Dec. 14, 2007 (JP) ................................. 2007-323521

(51) Int. Cl.
*H01L 29/76* (2006.01)

(52) U.S. Cl.
USPC .................................. 257/531; 257/E29.134

(58) Field of Classification Search .................... 257/531
See application file for complete search history.

(56) References Cited

U.S. PATENT DOCUMENTS

| 5,936,299 A | 8/1999 | Burghartz et al. |
| 6,426,543 B1 | 7/2002 | Maeda et al. |
| 6,849,913 B2 | 2/2005 | Ohkubo et al. |
| 6,921,959 B2 | 7/2005 | Watanabe |
| 7,262,481 B1 | 8/2007 | Marques |
| 2003/0075776 A1 | 4/2003 | Ohkubo et al. |
| 2003/0122648 A1 | 7/2003 | Ou et al. |
| 2005/0051869 A1 | 3/2005 | Watanabe |
| 2005/0247999 A1* | 11/2005 | Nishikawa et al. ........... 257/531 |

FOREIGN PATENT DOCUMENTS

| JP | 11-274412 | 10/1999 |
| JP | 2001-352039 | 12/2001 |
| JP | 2003-133431 | 5/2003 |
| JP | 2004-221317 A | 8/2004 |
| JP | 2005-086084 | 3/2005 |
| TW | 529046 B | 4/2003 |

OTHER PUBLICATIONS

Translation of JP 2004-221317 A, downloaded Sep. 17, 2010.
Chinese Office Action dated Nov. 20, 2009, with English-language translation.
Notification of the Third Office Action dated Jan. 18, 2012 (with text).

* cited by examiner

*Primary Examiner* — Thomas L Dickey
(74) *Attorney, Agent, or Firm* — McGinn IP Law Group, PLLC

(57) ABSTRACT

A semiconductor device includes a substrate including a diffusion region, a device isolation region, an inductor region, and a guard ring region, a guard ring formed on the substrate to be connected to the diffusion region in the guard ring region, an insulating film formed on the substrate, in which the insulating film includes an interconnect, and an inductor formed in the inductor region, in which the guard ring region surrounds the inductor region and the device isolation region.

19 Claims, 16 Drawing Sheets

SEMICONDUCTOR DEVICE INCLUDING A GUARD RING SURROUNDING AN INDUCTOR

The present application is a Continuation application of U.S. patent application Ser. No. 12/292,665, filed on Nov. 24, 2008 now U.S. Pat. No. 7,999,386, which is based on and claims priority from Japanese patent application No. 2007-323521, filed on Dec. 14, 2007, the entire contents of which are incorporated herein by reference.

BACKGROUND

1. Technical Field

The present invention relates to a semiconductor device, and in particular to a semiconductor having an inductor.

2. Related Art

Mixed mounting of active elements such as MOS transistors and passive elements such as inductors on a semiconductor substrate may raise a problem of noises influential among devices. Japanese Laid-Open Patent Publication 2005-86084 and U.S. Pat. No. 5,936,299 disclose configurations respectively provided with a guard ring which is configured by an impurity diffused layer formed by implanting a P-type or N-type impurity into a semiconductor substrate so as to surround an inductor, aiming at preventing characteristics of the inductor from being affected by noises generated from other circuit elements such as MOS transistor.

There is also known a technique of reducing parasitic capacitance between the inductor and the semiconductor substrate, by suppressing eddy current generated in the substrate while being affected by the inductor.

Japanese Laid-Open Patent Publication 2003-133431 describes a configuration such that an insulating interlayer is locally buried in a surficial portion of a semiconductor substrate, a CMOS is formed in a region having no insulating interlayer provided thereto, and the inductor is provided to a region over the insulating interlayer while being corresponded thereto. Japanese Laid-Open Patent Publication 2001-352039 describes a configuration containing a region having transistors (Q31, Q32) formed therein and a region having an insulating interlayer formed therein, and having an inductor provided over the region having the insulating interlayer formed therein. Japanese Laid-Open Patent Publication No. H11-274412 describes a configuration having an inductor formed over the surface of an insulating material filling up a trench.

The present inventors have recognized as follows. The conventional guard ring has been formed only up to a level of height of a first interconnect layer. For this reason, for the case where the inductor was formed in the upper layer of a multi-layer structure, a problem of causing electromagnetic influences exerted through the lateral space of the inductor may still remain. Therefore, there has been still a room for improving noises possibly induced by the inductor in other devices such as other active elements or passive elements, and possibly induced by the other elements in the inductor.

SUMMARY

In one aspect of the present invention, there is provided a semiconductor device which includes:

a semiconductor substrate;

a plurality of insulating interlayers formed over the semiconductor substrate, and containing a plurality of interconnect layers;

an inductor formed over the semiconductor substrate while placing at least one of the insulating interlayers in between; and a guard ring surrounding the inductor in a plan view, so as to isolate the inductor from other regions, wherein the guard ring includes:

an annular impurity diffused layer provided in the surficial portion of the semiconductor substrate; and an annular electro-conductor connected to the impurity diffused layer, and extended across the plurality of interconnect layers in the plurality of insulating interlayers, up to a layer having a level of height not lower than the layer having the inductor provided therein.

By adopting this configuration, noises possibly induced by the inductor in other elements or possibly induced by the other elements in the inductor through the lateral space of the inductor, may be prevented.

It is to be understood that also any combinations of the above-described constituents, and also any exchanges of expression of the present invention among the method, device and so forth, may be effective as exemplary embodiments of the present invention.

According to the present invention, noises induced by the inductor or induced in the inductor may effectively be suppressed, and thereby performances of the inductor may be improved.

BRIEF DESCRIPTION OF THE DRAWINGS

The above and other objects, advantages and features of the present invention will be more apparent from the following description of certain preferred exemplary embodiments taken in conjunction with the accompanying drawings, in which.

DETAILED DESCRIPTION

Figure 1:
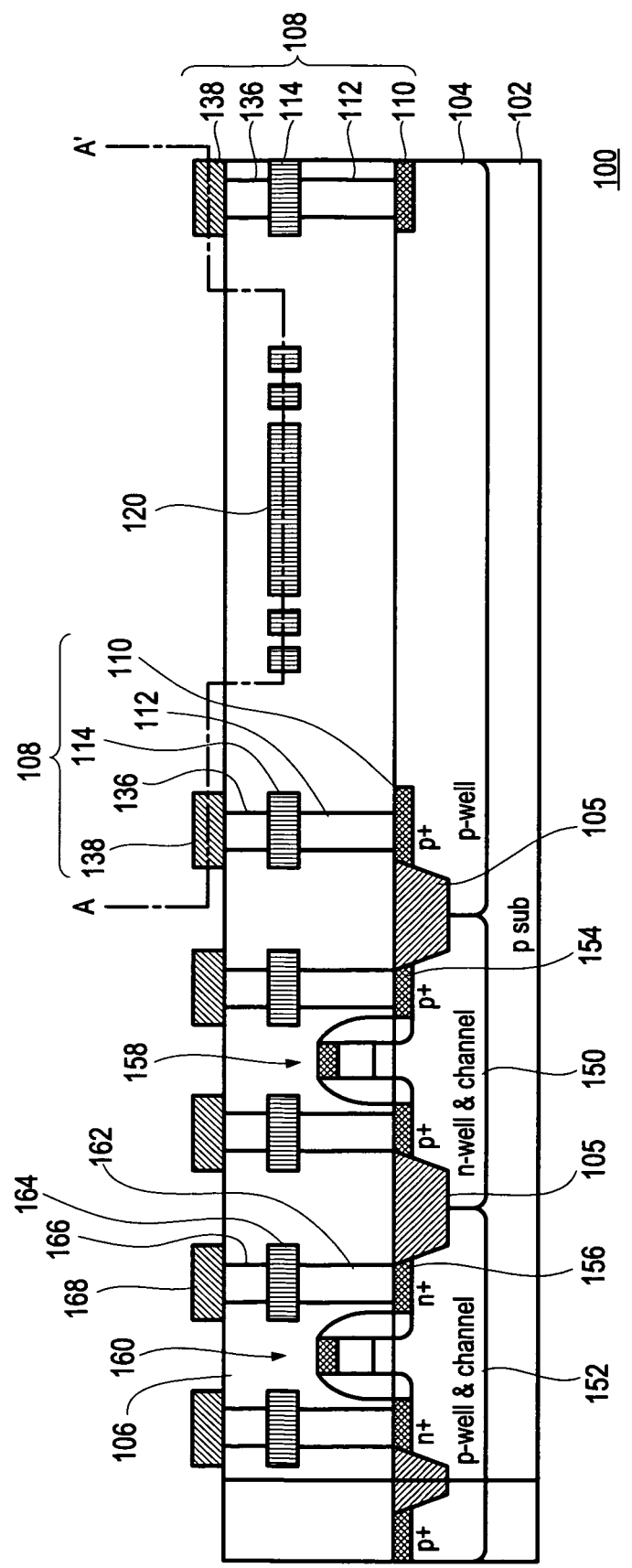
FIG. 1 is a sectional view showing an exemplary configuration of a semiconductor device in a first exemplary embodiment of the present invention.

The invention will now be described herein with reference to illustrative exemplary embodiments. Those skilled in the art will recognize that many alternative exemplary embodiments can be accomplished using the teachings of the present invention and that the invention is not limited to the exemplary embodiment illustrated for explanatory purposes.

Exemplary embodiments of the present invention will be explained below, referring to the attached drawings. In all drawings, any similar constituents will be given with same reference numerals, so as to avoid repetitive explanations.

First Exemplary Embodiment

FIG. 1 is a sectional view showing an exemplary configuration of a semiconductor device of this exemplary embodiment.

In this exemplary embodiment, a semiconductor device 100 contains a silicon substrate 102 (semiconductor substrate). The silicon substrate 102 herein has device isolation insulating films 105, and has also a P-well 104, an N-well 150 and a P-well 152 respectively isolated by the device isolation insulating films 105, formed in the surficial portion thereof. The semiconductor device 100 contains an insulating film 106 formed over the silicon substrate 102, an inductor 120 formed over the P-well 104 while placing a portion of the insulating film 106 in between, a transistor 158 and a transistor 160 respectively formed over the N-well 150 and the P-well 152 in the silicon substrate 102, and a guard ring 108 surrounding the inductor 120 in a plan view, so as to isolate the inductor 120 from other regions having the transistor 158 and the transistor 160 formed therein. In the N-well 150 and the P-well 152, a p$^+$-impurity diffused region 154 and an n$^+$-impurity diffused region 156 are respectively provided. The insulating film 106, described herein as a single entirety after combining a plurality of insulating films, may be configured by a plurality of insulating films containing a plurality of insulating interlayers. Each insulating interlayer may have vias and interconnects appropriately formed therein. The layers herein having the vias formed therein are referred to as via layers, and the layers having the interconnects formed therein are referred to as interconnect layers. In this exemplary embodiment, the insulating film 106 may be configured as containing a plurality of insulating interlayers, such as having the via layers and the interconnect layers alternately disposed therein. The inductor 120 herein allows current typically having a frequency of 5 GHz or higher to flow therethrough.

The guard ring 108 is formed so as to surround the inductor 120 on all sides in a plan view, and contains an impurity diffused layer 110 which is a P$^+$-region provided in the surficial portion of the silicon substrate 102 in the P-well 104, and an electro-conductor connected to said impurity diffused layer 110, having a pattern in a plan view same as that of the impurity diffused layer 110, and provided in the insulating film 106. The electro-conductor has a structure in which a via 112, an interconnect 114, a via 136, and an interconnect 138 are stacked in this order. In this exemplary embodiment, the electro-conductor composing the guard ring 108 extends up to a layer having a level of height higher than the layer having the inductor 120 provided therein. More specifically, the inductor 120 in this exemplary embodiment is provided to the same layer that the lower interconnect 114 composing the guard ring 108 is provided. The guard ring 108 extends up to the via 136 and the interconnect 138 laid higher than the interconnect 114. By adopting this configuration, noises may effectively be reduced. In addition, the guard ring 108 may have a larger area, and may consequently be reduced in resistivity.

In the region of the semiconductor device 100 having the transistor 158 and the transistor 160 formed therein, vias 162, interconnects 164, vias 166, and interconnects 168 are provided in this order. The vias 162, the interconnects 164, the vias 166, and the interconnects 168 are provided respectively in the same layers that the via 112, the interconnect 114, the via 136, and the interconnect 138 are provided. The via 112 and the vias 162; the interconnect 114 and the interconnects 164; the via 136 and the vias 166; and the interconnect 138 and the interconnects 168; are respectively formed at the same time.

Figure 2:
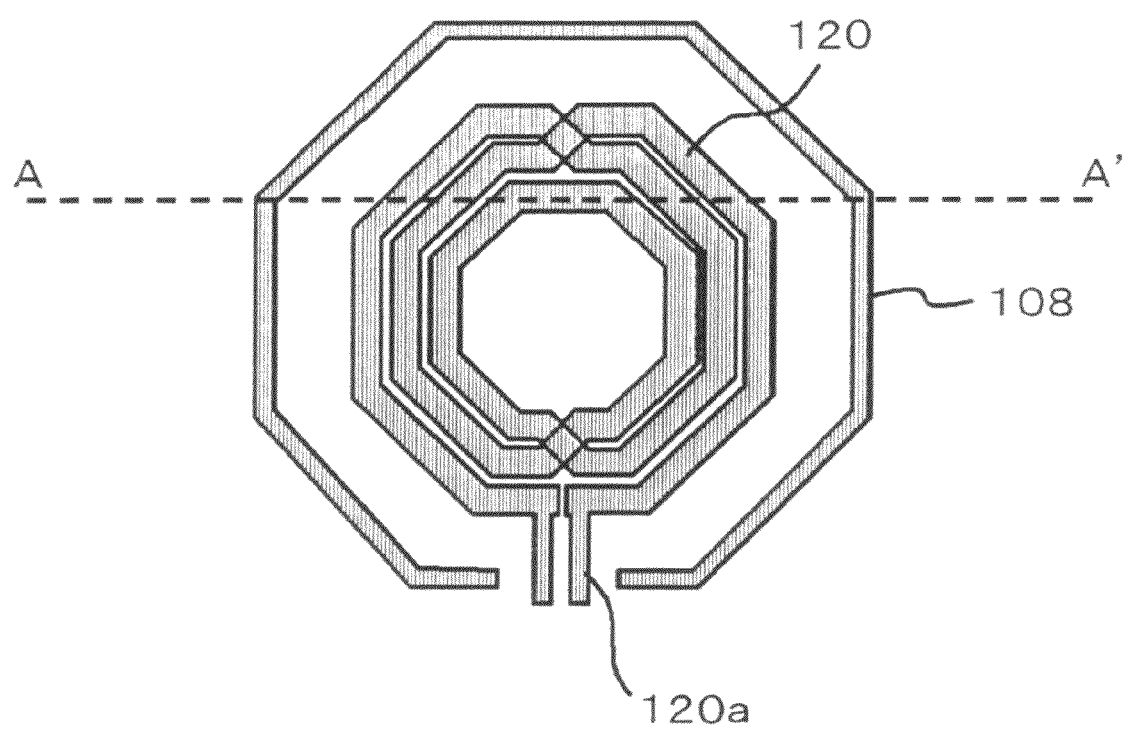
FIG. 2 is a plan view showing a configuration of portions of an inductor and a guard ring in the first exemplary embodiment of the present invention.

FIG. 2 is a plan view showing a configuration of portions of the inductor 120 and the guard ring 108 in this exemplary embodiment. The portions of the inductor 120 and the guard ring 108 shown in FIG. 1 correspond to a section taken along line A-A' in FIG. 2. The guard ring 108 is formed so as to surround the whole periphery of the inductor 120. The guard ring 108 has a disconnected portion only in a layer having an extraction interconnect 120a of the inductor 120 formed therein, so as to avoid electrical connection with the extraction interconnect 120a, but is formed in the other layers in an annular pattern so as to surround the inductor 120 on all sides in a plan view. The vias including the via 112, the via 136 and so forth may be formed also by a slit vias, although not specifically limited.

In this exemplary embodiment, the guard ring 108 is applied with the ground potential as a reference potential. The guard ring 108 is electrically connected at a certain site thereof to the ground potential, wherein too large resistivity of the guard ring 108 per se may cause potential difference from site to site. Since the guard ring 108 of this exemplary embodiment has the electro-conductor composed of metals such as the via 112, the interconnect 114, the via 136, and the interconnect 138, resistivity of the guard ring 108 may be suppressed to a low level, and thereby the potential difference by sites may be avoidable.

In this exemplary embodiment, the ground potential is supplied to the guard ring 108 through a route different from that allowing supply of the ground potential therethrough to other devices including the transistor 158, the transistor 160 and so forth on the silicon substrate 102.

Figure 3:
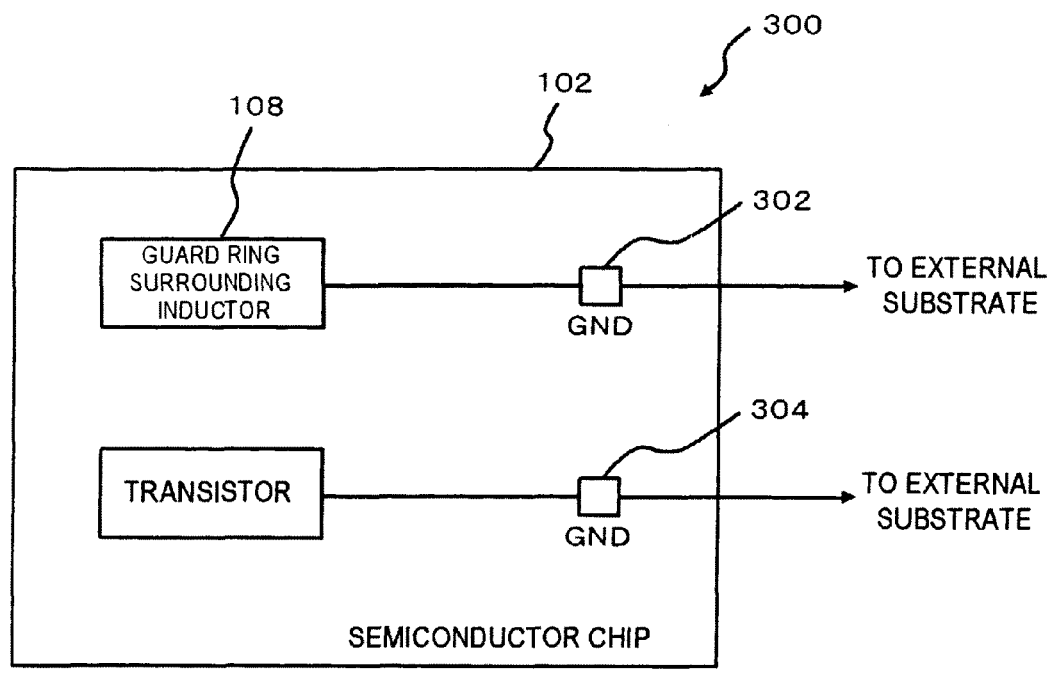
FIG. 3 is a block diagram showing a route of supply of the ground potential to the guard ring.

FIG. 3 is a block diagram showing this state. What is shown herein is a configuration of a semiconductor chip 300 containing a semiconductor device 100 encapsulated as a chip. The semiconductor chip 300 is provided with a pad 302 and a pad 304. The pad 302 and the pad 304 herein are respectively connected to external substrates, and are applied with the ground potential. In this exemplary embodiment, an interconnect drawn out from the pad 302 and connected to the guard ring 108 is not electrically connected to the pad 304 on the silicon substrate 102. Accordingly, the noises may further be reduced.

Figure 4:
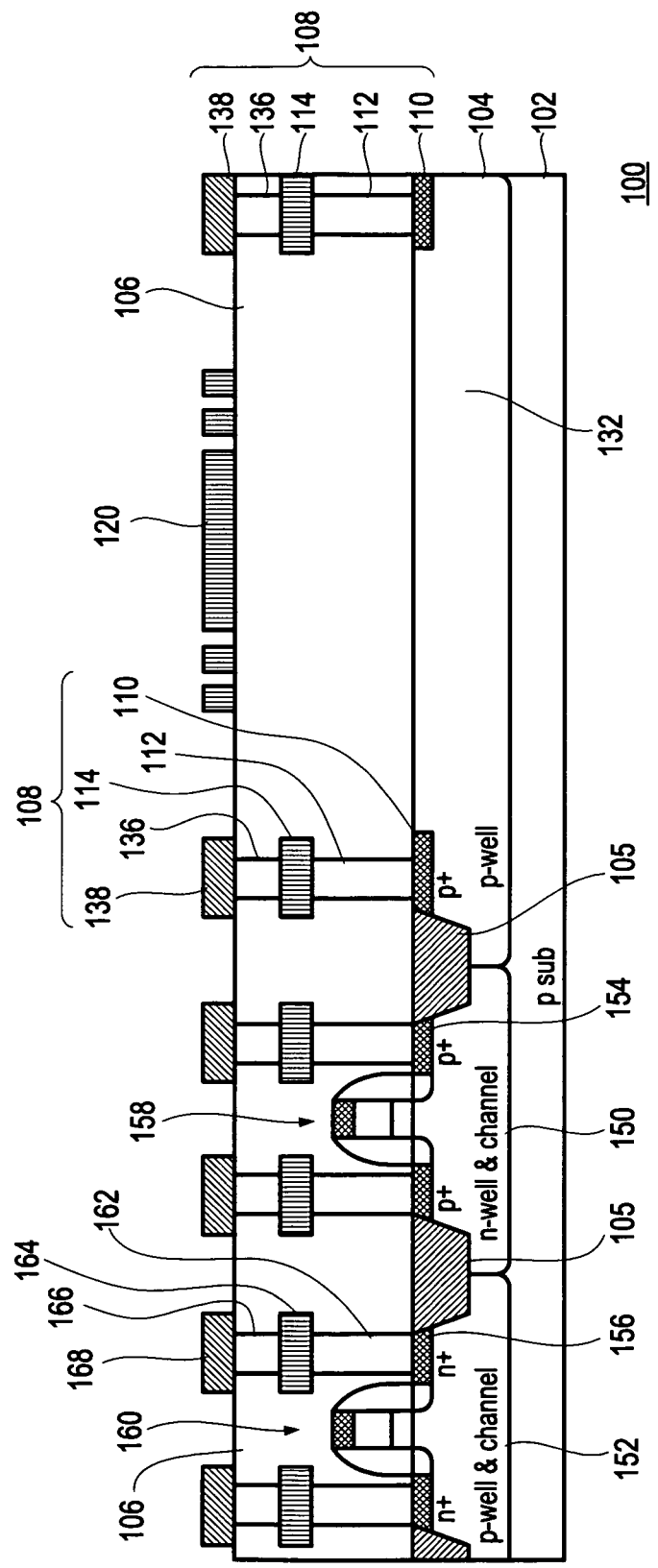
FIG. 4 is a sectional view showing another exemplary configuration of the semiconductor device in the first exemplary embodiment of the present invention.

FIG. 4 is a drawing showing another exemplary embodiment of the semiconductor device 100 shown in FIG. 1. This exemplary embodiment differs from the exemplary embodiment shown in FIG. 1, in that the inductor 120 is provided in the same layer that the upper interconnect 138 is provided. Because the guard ring 108 in this exemplary embodiment extends across a plurality of interconnect layers, the guard ring 108 may be extended up to a layer having the same level of height that the inductor 120 is provided even if the inductor 120 is disposed in the upper portion of the multi-layer structure. Accordingly, the noises may further be reduced. Also in this case, a via and an interconnect may further be provided on the interconnect 138, so as to extend the guard ring 108 up to a layer having a level of height higher than a layer having the inductor 120 provided therein.

Effects of this exemplary embodiment will be explained.

Because the guard ring 108 in this exemplary embodiment extends across a plurality of interconnect layers, the guard ring 108 may be extended up to a layer having a level of height higher than a layer having the inductor 120 formed therein, or the guard ring 108 may be extended up to a layer having a level of height not lower than a layer having the inductor 120 formed therein, even for the case where the inductor 120 is provided in the upper portion of the multi-layer structure. Accordingly, influences of electromagnetic field through the lateral space of the inductor 120 may be reduced, and thereby noises possibly induced by the inductor 120 in other devices, and noises possibly induced by the other devices in the inductor 120 may be reduced.

The guard ring 108 may be widened in the area thereof, and may therefore be reduced in the resistivity. Accordingly, local variation in potential of the inductor 120 may be prevented, and thereby the potential may be made uniform over the entire portion. In this way, the function of the guard ring, aimed at reducing the noises, may be enhanced.

In addition, because the ground potential is supplied to the guard ring 108 through a route different from that allowing supply of the ground potential therethrough to other devices including the transistor 158, the transistor 160 and so forth on the silicon substrate 102, noises possibly induced by the inductor 120 in other devices, and noises possibly induced by the other devices in the inductor 120 may be reduced in a more effective manner.

Moreover, as shown in this exemplary embodiment, a route allowing return current of signal flowing through the inductor 120 may be clarified by providing the guard ring 108 around the inductor 120. For an exemplary case having no guard ring 108, it may be understood that the return current of signal flowing through the inductor 120 flows typically from the P-well 104 through the silicon substrate 102 to the P-well 152. In this exemplary embodiment, provision of the guard ring 108 may make the return current flow through the guard ring 108, so that the route of return current may be clarified. In this exemplary embodiment, the guard ring 108 may be reduced in the resistivity thereof, while being extended up to a layer having a level of height not lower than a layer having the inductor formed therein, so that the route of return current may further be clarified.

Second Exemplary Embodiment

Figure 5:
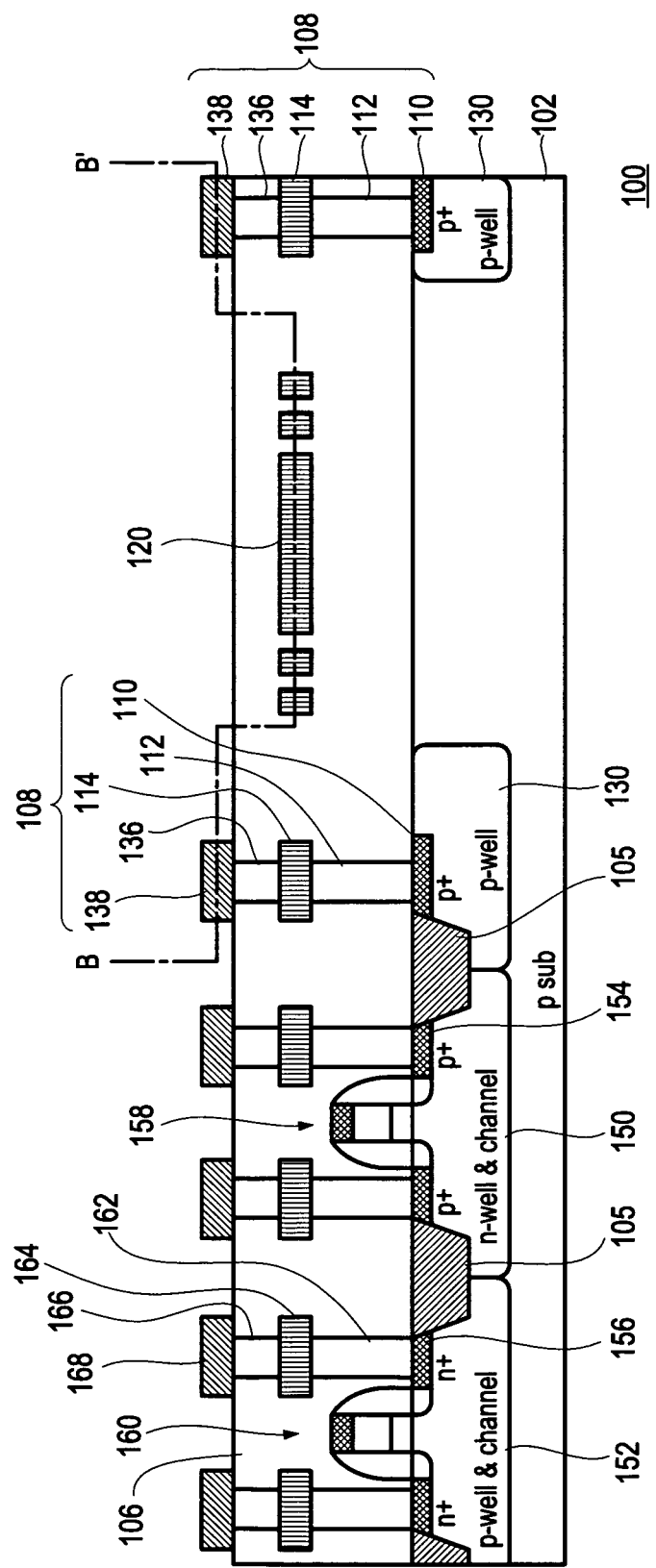
FIG. 5 is a sectional view showing an exemplary configuration of a semiconductor device in a second exemplary embodiment of the present invention.

FIG. 5 is a sectional view showing an exemplary configuration of a semiconductor device of this exemplary embodiment.

Figure 6:
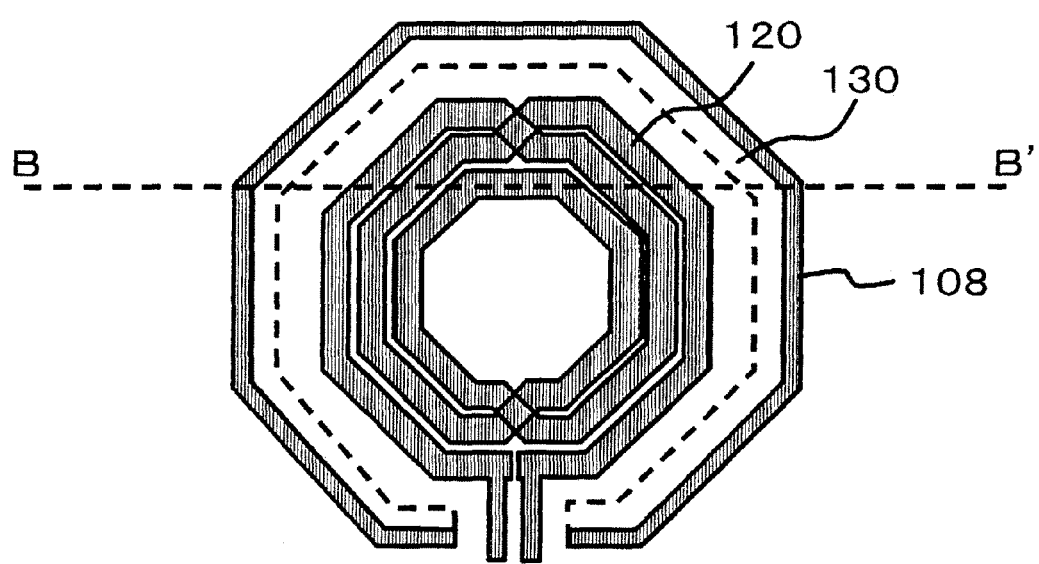
FIG. 6 is a plan view showing a configuration of portions of an inductor and a guard ring in the second exemplary embodiment of the present invention.

This exemplary embodiment differs from the configuration of the first exemplary embodiment, in that the P-well 130 is not provided in the surficial portion of the silicon substrate 102, in a region in a plan view overlapping the inductor 120. FIG. 6 is a plan view showing a configuration of portions of the inductor 120 and the guard ring 108 in this exemplary embodiment. The portions of the inductor 120 and the guard ring 108 shown in FIG. 5 correspond to a section taken along line B-B' in FIG. 6.

In this exemplary embodiment, as shown in FIG. 6, the P-well 130 is not formed in the region overlapping the inductor 120. The P-well 130 is formed along a region overlapping the guard ring 108.

Figure 7:
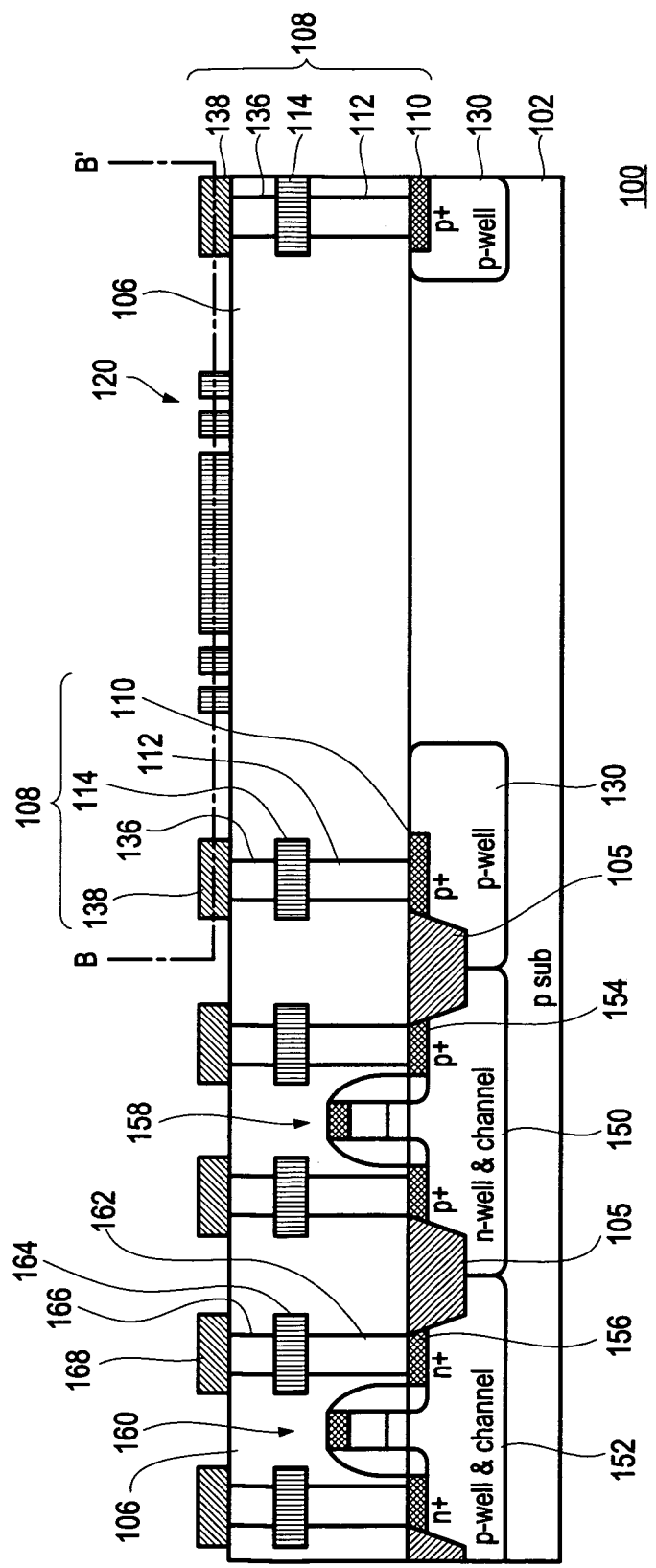
FIG. 7 is a sectional view showing another exemplary configuration of the semiconductor device in the second exemplary embodiment of the present invention.

FIG. 7 is a drawing showing another exemplary embodiment of the semiconductor device 100 shown in FIG. 5. This exemplary embodiment differs from the exemplary embodiment shown in FIG. 5, in that the inductor 120 is disposed in the same layer that the interconnect 138 is provided. Also in this case, a via and an interconnect may further be provided on the interconnect 138, so as to extend the guard ring 108 up to a layer having a level of height higher than a layer having the inductor 120 provided therein.

Effects of this exemplary embodiment will be explained.

Also in this exemplary embodiment, effects similar to those described in the first exemplary embodiment may be obtained. Besides these, also the effects below may be obtained.

If the coil-like inductor 120 is formed on the P-well 120 having a high impurity concentration formed in the surficial portion of the silicon substrate 102, counter induced current may generate in the P-well, by a contribution of magnetic flux generated by the inductor 120. The counter induced current generated in the P-well 130, characterized by eddy current, induces magnetic flux in the direction opposite to that generated by the inductor 120, and thereby induces counter induced current in the inductor 120. As a consequence, intensity of magnetic field of the inductor 120 decreases. The decrease in the intensity of magnetic field results in degradation in Q-value of the inductor 120. Since the P-well 130 is not provided right under the inductor 120 in a plan view in this exemplary embodiment, the eddy current may be prevented from generating, and thereby the inductor may be prevented from generating therein counter induced current. The inductor 120 may therefore be prevented from being degraded in characteristics including Q-value or the like.

Third Exemplary Embodiment

Figure 8:
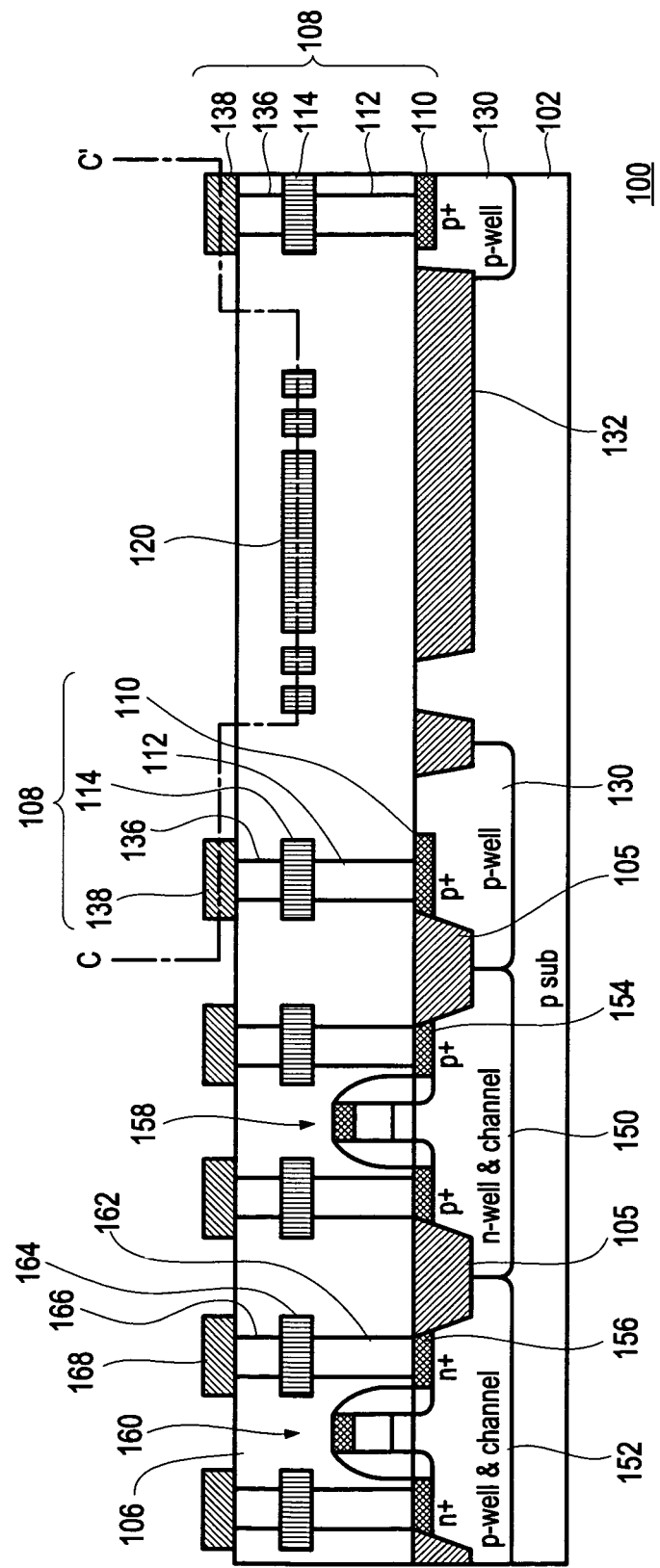
FIG. 8 is a sectional view showing an exemplary configuration of a semiconductor device in a third exemplary embodiment of the present invention.

FIG. 8 is a sectional view showing an exemplary configuration of a semiconductor device of this exemplary embodiment.

Figure 9:
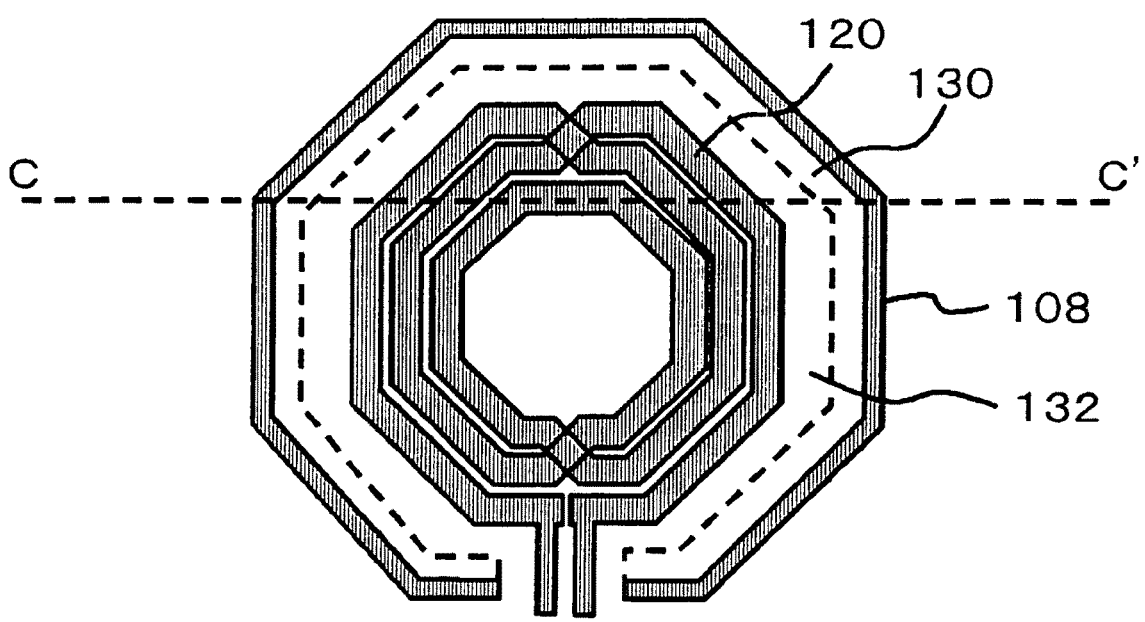
FIG. 9 is a plan view showing a configuration of portions of an inductor and a guard ring in the third exemplary embodiment of the present invention.

This exemplary embodiment differs from the configurations shown in the first and second exemplary embodiments, in that the semiconductor device 100 contains a buried insulating film 132 provided in the surficial portion of the silicon substrate 102 in a region thereof overlapping the inductor 120 in a plan view. FIG. 9 is a plan view showing a configuration of portions of an inductor 120 and a guard ring 108 in this exemplary embodiment of the present invention. The portions of the inductor 120 and the guard ring 108 shown in FIG. 8 correspond to a section taken along line C-C' in FIG. 9.

As shown in FIG. 9, the buried insulating film 132 in this exemplary embodiment is provided over the entire region overlapping the inductor 120 in a plan view. The P-well 130 is formed along a region overlapping the guard ring 108.

Figure 10:
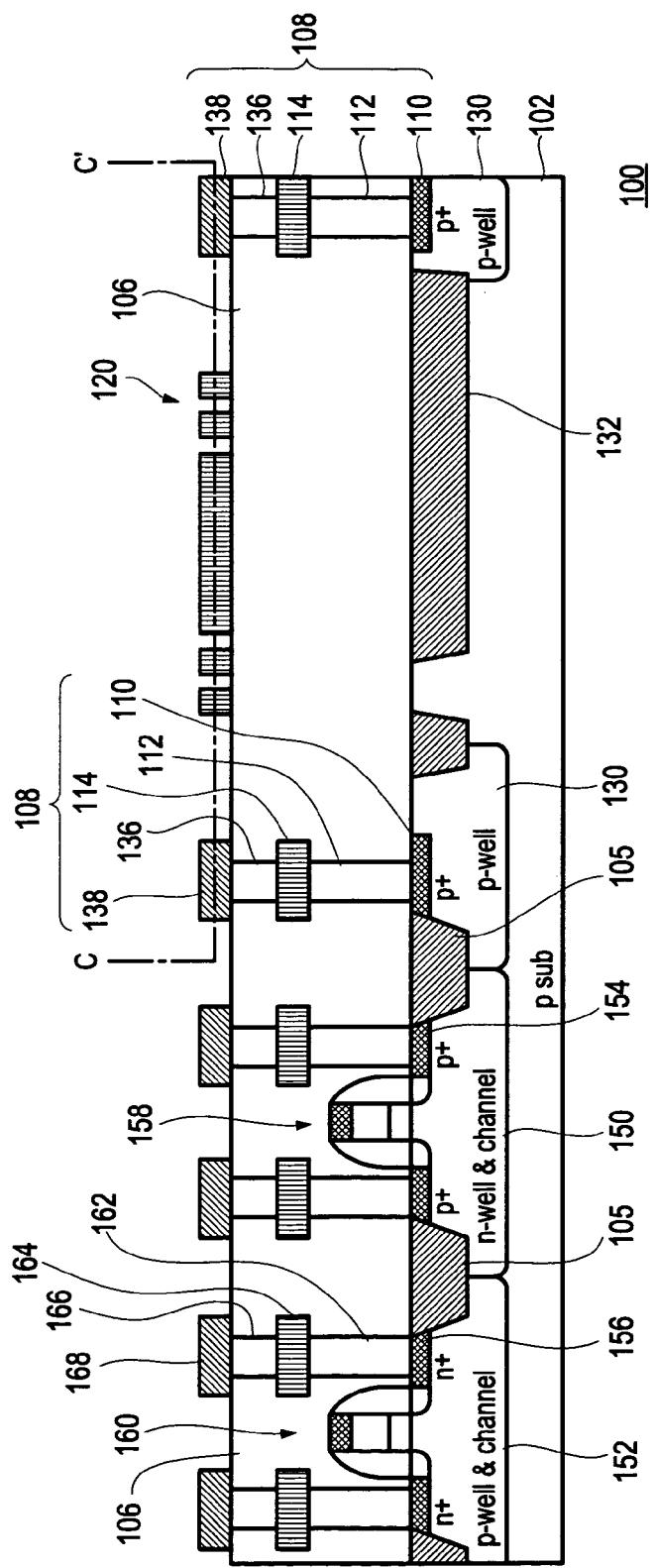
FIG. 10 is a sectional view showing another exemplary configuration of the semiconductor device in the third exemplary embodiment of the present invention.

FIG. 10 is a drawing showing another exemplary embodiment of the semiconductor device 100 shown in FIG. 8. This exemplary embodiment differs from the exemplary embodiment shown in FIG. 8, in that the inductor 120 is provided in the same layer that the interconnect 138 is provided. Also in this exemplary embodiment, a via and an interconnect may further be provided on the interconnect 138, so as to extend the guard ring 108 up to a layer having a level of height higher than a layer having the inductor 120 provided therein.

Effects of this exemplary embodiment will be explained.

Also in this exemplary embodiment, effects similar to those described in the first exemplary embodiment may be obtained. Besides these, also the effects below may be obtained.

In this exemplary embodiment, there is no region having the silicon substrate 102 exposed therein, in the region overlapping the inductor 120 in a plan view, so that the eddy current described above in the second exemplary embodiment may more effectively be prevented from generating, and thereby the counter induced current may be prevented from generating in the inductor 120. The inductor 120 may therefore be prevented from being degraded in characteristics including Q-value or the like.

Figure 11:
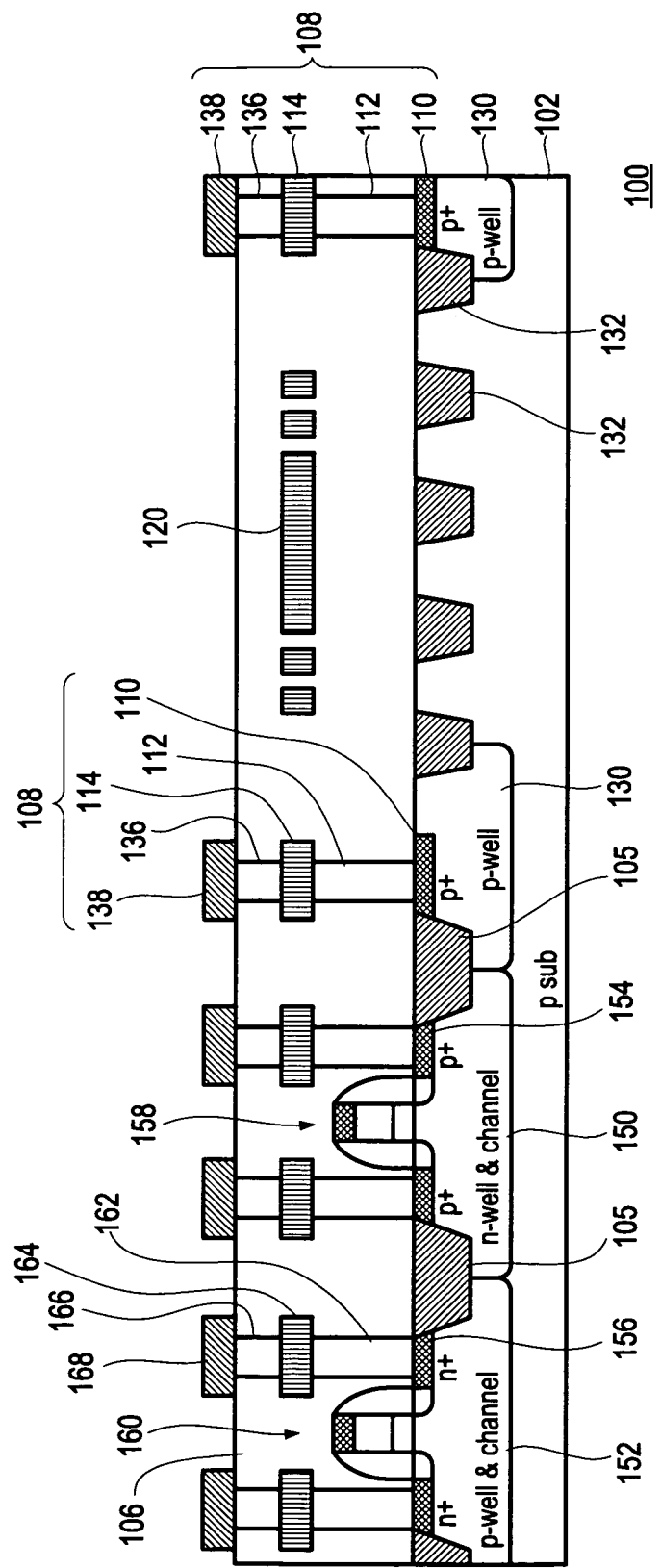
FIG. 11 is a sectional view showing still another exemplary configuration of the semiconductor device in the third exemplary embodiment.

FIG. 11 is a sectional view showing still another exemplary configuration of the semiconductor device in this exemplary embodiment.

This exemplary embodiment differs from the configuration shown in FIG. 8, in that the buried insulating film 132 is provided in the region overlapping the inductor 120 in a plan view, so as to allow the surface of the semiconductor substrate 102 to expose like islands. Although this configuration inevitably has sites of the silicon substrate 102 disposed right under the inductor 120, the eddy current described in the above may successfully be suppressed to a low level, because each site of the silicon substrate 102 exposes like an island, with only a small area. The inductor 120 may therefore be prevented from being degraded in characteristics including Q-value or the like.

Figure 12:
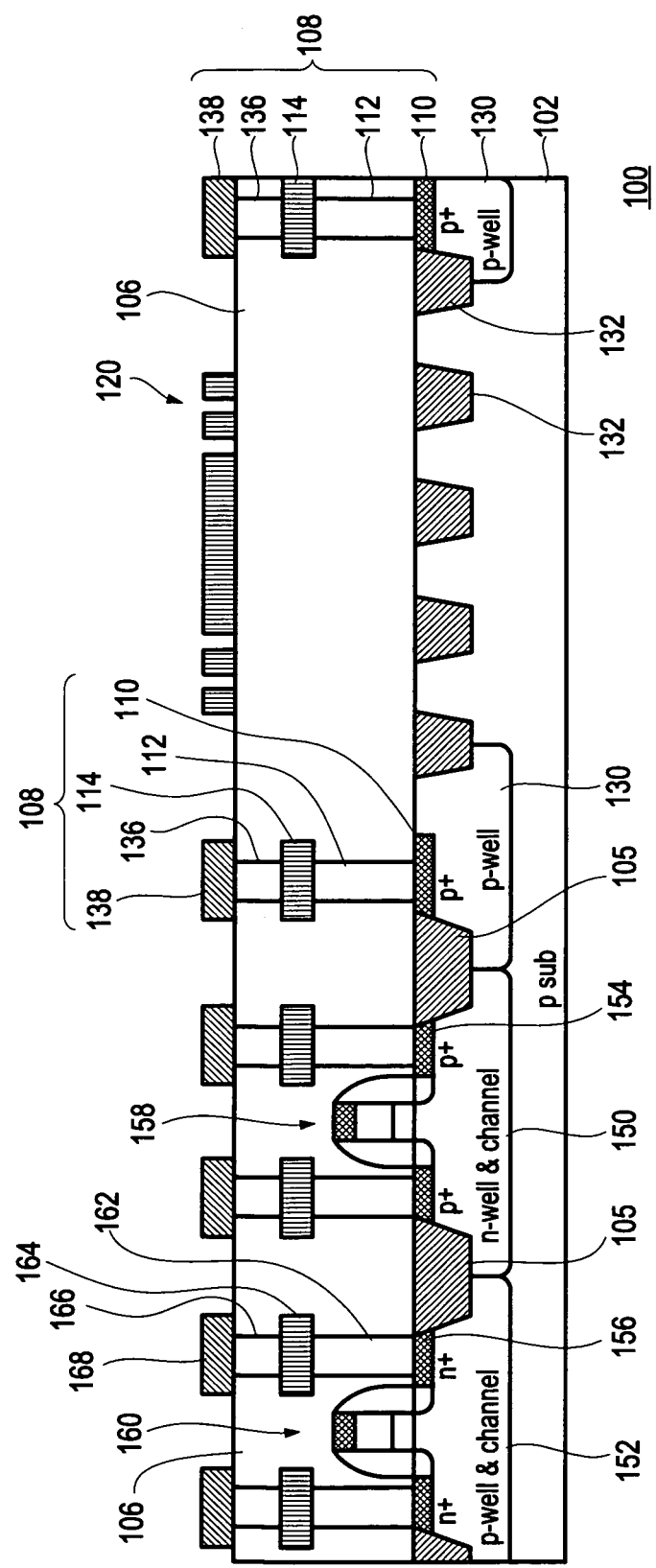
FIG. 12 is a sectional view showing still another exemplary configuration of the semiconductor device in the third exemplary embodiment.

FIG. 12 is a drawing showing still another exemplary embodiment of the semiconductor device 100 shown in FIG. 11. This exemplary embodiment differs from the exemplary embodiment shown in FIG. 11, in that the inductor 120 is provided to the same layer that the interconnect 138 is provided. Also in this exemplary embodiment, a via and an interconnect may further be provided on the interconnect 138, so as to extend the guard ring 108 up to a layer having a level of height higher than a layer having the inductor 120 provided therein.

Fourth Exemplary Embodiment

Figure 13:
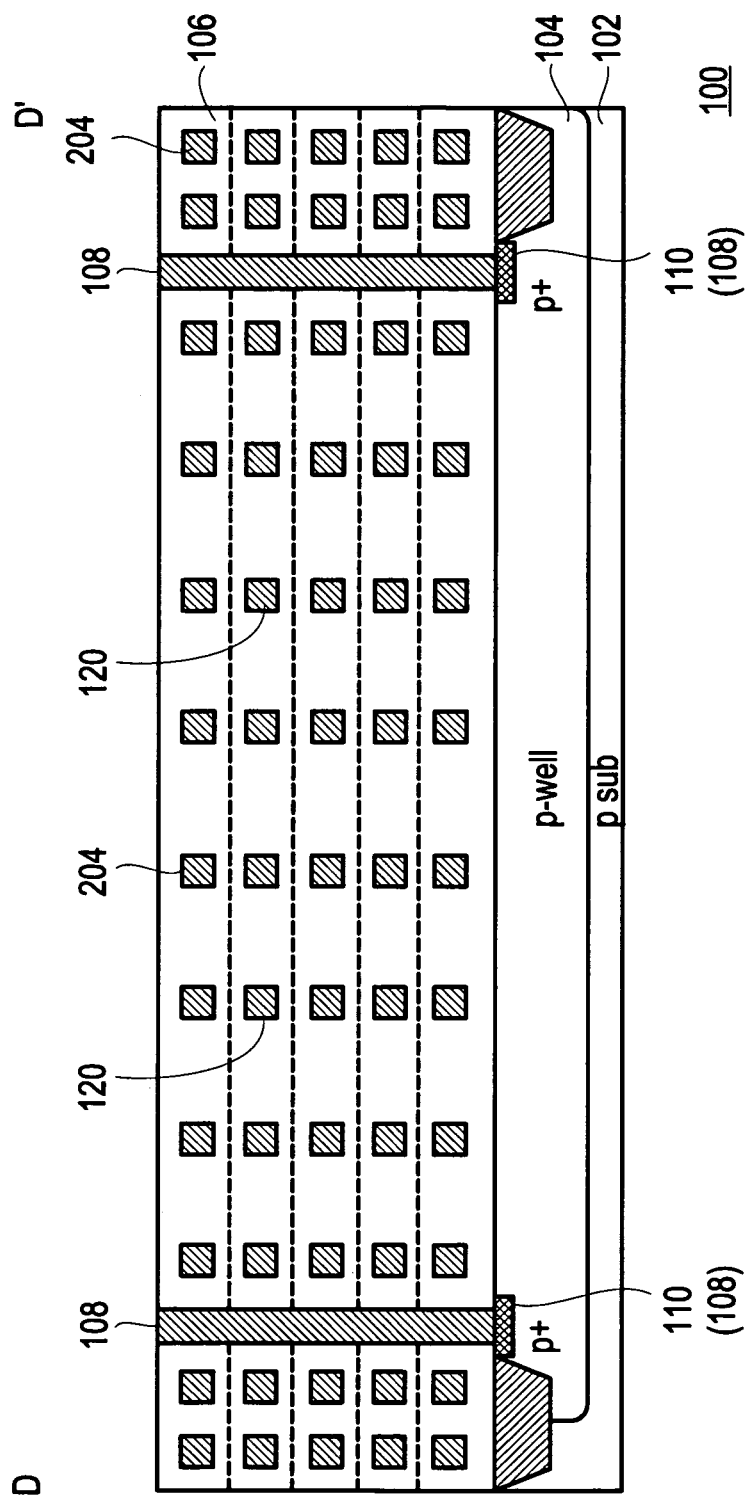
FIG. 13 is a sectional view showing an exemplary configuration of a semiconductor device of a fourth exemplary embodiment of the present invention.
Figure 14:
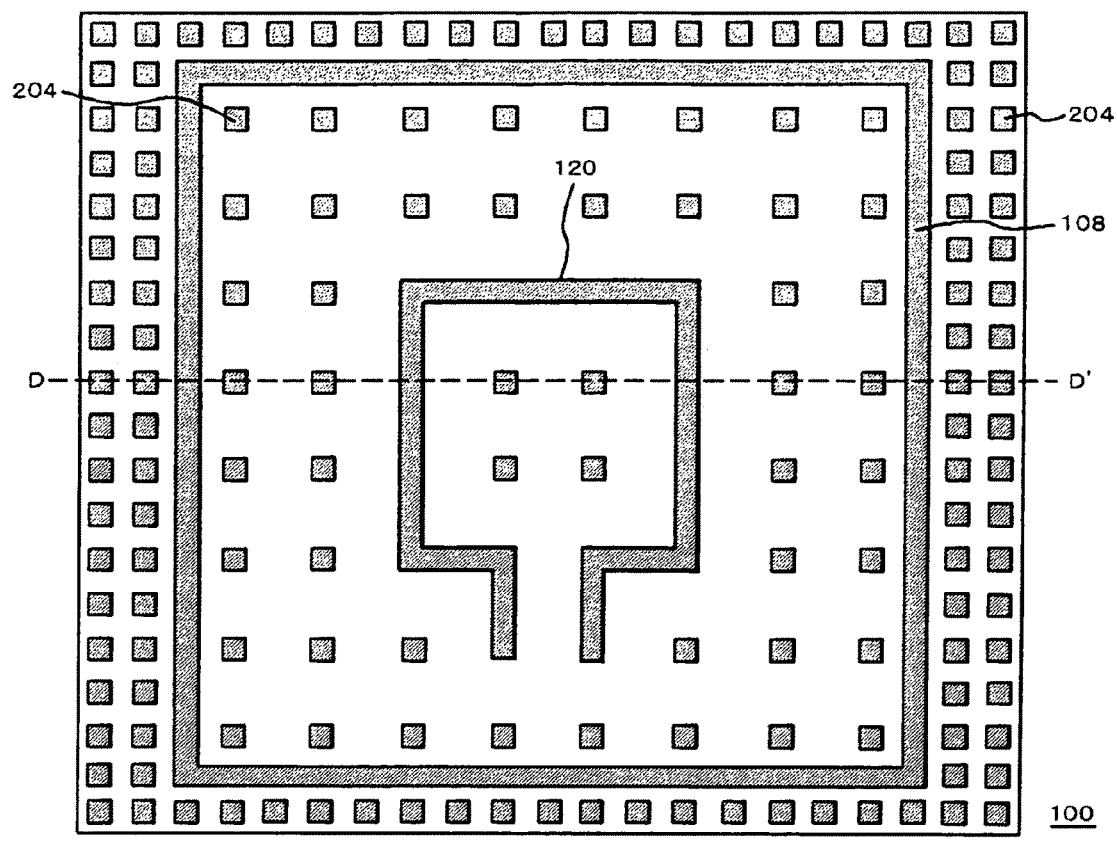
FIG. 14 is plan view showing configuration of portion of inductor and guard ring in the fourth exemplary embodiment of the present invention.
Figure 15:
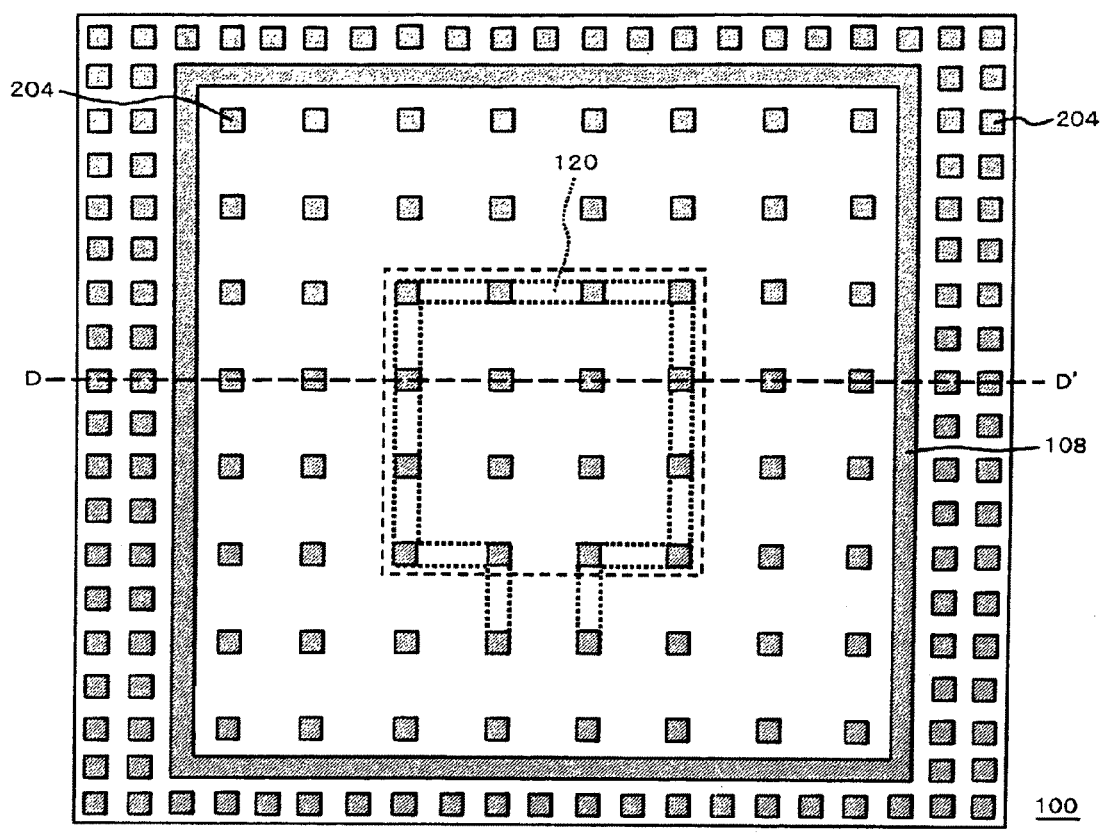
FIG. 15 is plan view showing configuration of portion of inductor and guard ring in the fourth exemplary embodiment of the present invention.

FIG. 13 is a sectional view showing an exemplary configuration of a semiconductor device of this exemplary embodiment. FIG. 14 and FIG. 15 are plan views showing configurations of the inductor 120 and the guard ring 108. FIG. 14 shows a configuration of a layer having the inductor 120 formed therein. FIG. 15 shows a configuration of a layer different from the layer having the inductor 120 formed therein. FIG. 13 corresponds to a section taken along line D-D' in FIG. 14 and FIG. 15.

This exemplary embodiment differs from the first to third exemplary embodiments, in that dummy metals 204 are dispersively arranged in the insulating film 106 in a plan view. Although the drawings herein show only a region having the inductor 120 formed therein, also this exemplary embodiment may be configured, similarly to as described in the first to third exemplary embodiments, configured as having the transistor 158 and the transistor 160 formed on the silicon substrate 102.

The dummy metal herein means patterned electro-conductors not affective to circuit configuration of the semiconductor device 100 irrespective of their presence or absence. As shown in FIG. 14, the dummy metals 204 are formed both in the internal and external areas of the coil-like inductor 120. As shown in FIG. 15, in this exemplary embodiment, the dummy metals 204 are provided also in a region overlapping the inductor 120 in a plan view.

In this exemplary embodiment, in a plan view, mean distance of every adjacent dummy metals 204 is larger in the internal area of the guard ring 108 than in the external area of the guard ring 108. Although the insulating film 106 is illustrated herein as a single entirety after combining a plurality of insulating films, the semiconductor device 100 of this exemplary embodiment may have a plurality insulating interlayers stacked on the silicon substrate 102. In this exemplary embodiment, mean distance in a plan view of every adjacent dummy metals 204 is larger in the internal area of the guard ring 108 than in the external area of the guard ring 108, in all layers. Since the individual dummy metals 204 have substantially same height, the dummy metals 204 in this exemplary embodiment are arranged in each layer, so that the amount of the dummy metals 204 per unit volume will be smaller in the internal area of the guard ring 108 than in the external area of the guard ring 108. The dummy metals 204 are arranged, also so that the amount of the dummy metals 204 per unit volume, summed up for all layers, may be smaller in the internal area of the guard ring 108 than in the external area of the guard ring 108.

As shown in FIG. 13, the guard ring 108 may be configured as being formed continuously across all layers of the plurality of insulating interlayers. Although not specifically limited, the guard ring 108 in the via layer may be configured by a slit via.

The dummy metals 204 are composed of a material same as that composing the inductor 120. Copper, aluminum or the like may be exemplified as the material. For the case where the inductor 120 and the dummy metals 204 are made of copper, these may be formed by the damascene process. The inductor 120 and the dummy metals 204 may preferably be formed at the same time.

Alternatively, for the case where the multi-layer structure of the semiconductor device 100 is formed by the single damascene process, the via layer may be configured as having no dummy metals 204 formed therein. This is because the via layer will not suffer from dishing or the like, which is causative of process variation in CMP process, unlike the interconnect layers. However, also the via layer may be provided with the dummy metals 204.

Effects of this exemplary embodiment will be explained.

Also in this exemplary embodiment, effects similar to those described in the first exemplary embodiment may be obtained. Besides these, also the effect below may be obtained.

In this exemplary embodiment, erosion, dishing and so forth may effectively be prevented, because the dummy metals 204 are dispersively arranged in the insulating film 106. The pattern of arrangement of the dummy metals 204 is more scarce in the internal area of the guard ring 108 than in the external area of the guard ring 108. By reducing the amount of dummy metals 204 in the region susceptible to magnetic field induced by the inductor 120, eddy current possibly generated in the dummy metals 204 may be suppressed. Accordingly, degradation of the Q-value of the inductor 120 may be suppressed to a low level. Another problem of increase in parasitic capacitance may arise, if a large number of dummy metals 204 are arranged in particular between the layer having the inductor 120 formed therein and the silicon substrate 102, because the dielectric material between the inductor 120 and the silicon substrate 102 becomes thinner. In this exemplary embodiment, the inductor 120 may be prevented from being degraded in the characteristics thereof, by limiting the amount of the dummy metals 204 in the internal area of the guard ring 108 to a necessarily minimum degree.

The above-described problem in that the inductor 120 is varied in the circuit constants thereof due to the eddy current generated in the dummy metals 204 may be distinct, when electric current of 5 GHz or above flows through the inductor 120. Accordingly, this situation may particularly appreciate the usefulness of this exemplary embodiment capable of suppressing the eddy current possibly generated in the dummy metals 204.

Figure 16:
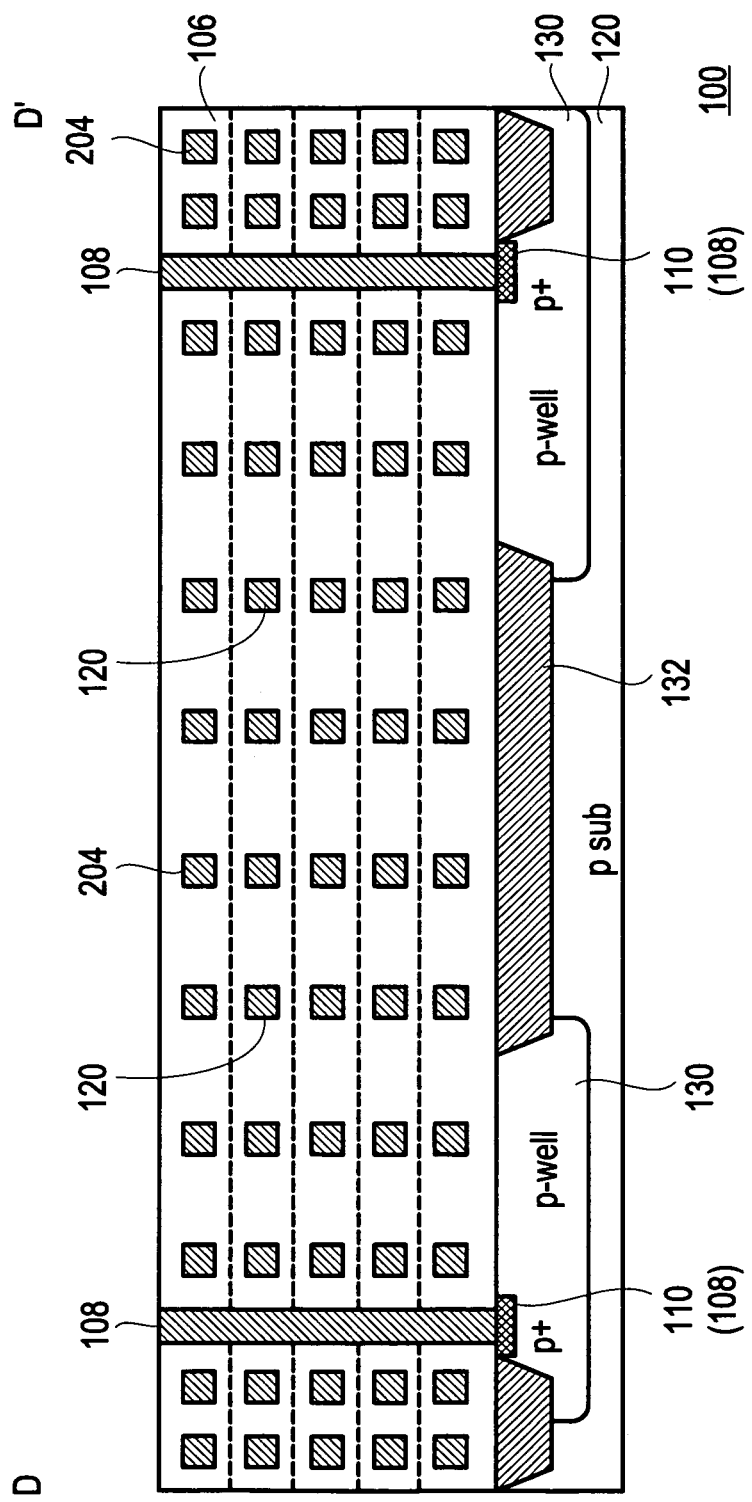
FIG. 16 is a sectional view showing another exemplary configuration of the semiconductor device in the fourth exemplary embodiment of the present invention.

FIG. 16 is a drawing showing another exemplary embodiment of the semiconductor device 100 of this exemplary embodiment. Also in this exemplary embodiment, similarly to as explained referring to the third exemplary embodiment, the semiconductor device 100 may be configured as being provided with the buried insulating film 132, in a region overlapping the inductor 120 in a plan view. Accordingly, the effects similar to those explained referring to the third exemplary embodiment may further be obtained.

The exemplary embodiments of the present invention have been described referring to the attached drawings, only as exemplary embodiments of the present invention, while allowing adoption of any other various configurations.

The inductor 120, described in the above exemplary embodiments as being formed in a single layer, may be configured as being formed across a plurality of layers. Also in this case, the guard ring 108 may be configured so as to extend up to a layer having a level of height not lower than that of the topmost layer of the inductor 120.

The exemplary embodiments in the above have been explained referring to the case where the inductor 120 has a coil form in a plan view, wherein the inductor 120 may have various forms including a zigzag form in a plan view, and a toroidal form having a ring-formed center axis aligned in parallel with the silicon substrate 102. Also in these cases, the guard ring 108 may be configured as extending up to a layer having a level of height not lower than that of the topmost layer of the inductor 120.

Although the above exemplary embodiments were configured as providing a single guard ring 108 around a single inductor 120, they may be configured also as providing a single guard ring 108 around a plurality of inductors 120. The semiconductor device 100 may contain a large number of combinations of the inductor 120 and the guard ring 108 surrounding therearound. In this case, the pad 302 explained in the first exemplary embodiment referring to FIG. 3 may be connected to a plurality of guard rings 108 on the silicon substrate 102. Also this configuration may raise an effect of reducing noise possibly induced by the inductor 120 in other devices or noise possibly induced by the other devices in the inductor 120, by supplying the ground potential to the pad 302 through a route different from that allowing supply of the ground potential therethrough to transistors including the transistor 158 and the like.

Still alternatively, although having been not specifically explained in the exemplary embodiments in the above, any configurations appropriately combining the configurations in all exemplary embodiments may be adoptable. For exemplary embodiment, the configuration of the fourth exemplary embodiment may have no P-well 130 provided therein in the region overlapping the inductor 120 in a plan view, similarly to as described in the second exemplary embodiment. The configuration of the fourth exemplary embodiment may also allow the surface of the silicon substrate 102 to expose like islands, in a region where the buried insulating film 132 overlaps the inductor 120 in a plan view, similarly to as explained in the third exemplary embodiment referring FIG. 11.

Still alternatively, all exemplary embodiments may be configured so that the ground potential is supplied to the guard ring 108 through a route different from that allowing supply of the ground potential therethrough to other devices including the transistor 158, the transistor 160 and so forth on the silicon substrate 102, similarly to as explained in the first exemplary embodiment referring to FIG. 3. By adopting this configuration, as described in the above, noises possibly induced by the inductor 120 in other devices, and noises possibly induced by the other devices in the inductor 120 may be reduced in a more effective manner.

As has been explained in the first exemplary embodiment referring to FIG. 3, the noises possibly induced by the inductor 120 in other devices and noises possible induced by the other devices in the inductor 120 may be reduced more effectively as compared with the related art, irrespective of configuration of the guard ring, by adopting a configuration such as supplying the ground potential to the guard ring 108 through a route different from that allowing supply of the ground potential therethrough to other devices including the transistor 158, the transistor 160 and so forth on the silicon substrate 102. Accordingly, even for an exemplary case configured so that the guard ring 108 is not formed so as to extend up to a layer having a level of height same as that of a layer having the inductor 120 formed therein, the noises may be reduced while being combined with a configuration such as supplying the ground potential to the guard ring 108 through a route different from that allowing supply of the ground potential therethrough to other devices including the transistor 158, the transistor 160 and so forth on the silicon substrate 102.

It is apparent that the present invention is not limited to the above exemplary embodiment, that may be modified and changed without departing from the scope and spirit of the invention.

What is claimed is:

1. A semiconductor device, comprising:
a substrate including a diffusion region, a device isolation region, an inductor region, and a guard ring region;
a guard ring formed on the substrate to be connected to the diffusion region in the guard ring region;
an insulating film formed on the substrate, the insulating film comprising an interconnect;
an inductor formed in the inductor region,
wherein the guard ring region surrounds the inductor region and the device isolation region; and
a plurality of dummy metals disposed in said insulating film,
wherein, in a plan view, a mean distance of every adjacent dummy metal is larger in an internal area of said guard ring than in an external area of said guard ring.

2. The semiconductor device as claimed in claim 1, wherein the inductor and the interconnect are formed in a same layer in the insulating film.

3. The semiconductor device as claimed in claim 1, wherein the inductor region and the device isolation region are overlapping.

4. The semiconductor device as claimed in claim 3, wherein the device isolation region is continuously formed within a surrounded area by the guard ring region.

5. The semiconductor device as claimed in claim 3, wherein the device isolation region is discontinuously formed within a surrounded area by the guard ring region.

6. The semiconductor device as claimed in claim 1, wherein, in a plan view, the inductor region overlaps with the device isolation region.

7. The semiconductor device as claimed in claim 1, further comprising:
an electro-conductor connected to said diffusion region and extended across said interconnect up to a layer having a height higher than a height of a layer that comprises said inductor region.

8. The semiconductor device as claimed in claim 1, further comprising:
a buried insulating film disposed in said substrate, in a region overlapping said inductor in a plan view.

9. The semiconductor device as claimed in claim 1, wherein the dummy metals are isolated from each other.

10. A semiconductor device, comprising:
a first insulating film formed over a substrate and including first dummy interconnects and second dummy interconnects; and
an inductor formed over the first insulating film,
wherein the first dummy interconnects are provided under the inductor and in a region that in a plan view overlaps with the inductor,
wherein, in the plan view, the second dummy interconnects are provided in an external region of the inductor,
wherein, in the plan view, a distance between the first dummy interconnects adjacent to each other is greater than a distance between the second dummy interconnects adjacent to each other.

11. The semiconductor device according to claim 10, wherein the inductor comprises a spiral inductor having a number of rings greater than 1.

12. The semiconductor device according to claim 11, wherein the first insulating film further includes interconnects comprising a same level layer as the first dummy interconnects and second dummy interconnects.

13. The semiconductor device according to claim 11, wherein the inductor is formed across a plurality of interconnection layers.

14. The semiconductor device according to claim 11, further comprising:
another inductor formed over the first insulating film; and
a guard ring formed over the first insulating film to surround the inductor and said another inductor,
wherein the guard ring is electrically connected to a diffusion region in the substrate.

15. The semiconductor device according to claim 10, wherein the inductor is formed across a plurality of interconnection layers.

16. The semiconductor device according to claim 10, further comprising:
an other inductor formed over the first insulating film; and
a guard ring formed over the first insulating film to surround the inductor and the other inductor,
wherein the guard ring is electrically connected to a diffusion region in the substrate.

17. The semiconductor device according to claim 16, wherein the first insulating film further includes interconnects comprising a same level layer as the first dummy interconnects and second dummy interconnects.

18. The semiconductor device according to claim 16, wherein the inductor is formed across a plurality of interconnection layers.

19. The semiconductor device according to claim 16, wherein the inductor is formed across a plurality of interconnection layers, and
wherein the inductor comprises a spiral inductor having a number of turns greater than 1.

* * * * *